US008890555B2

(12) United States Patent
Tsuji

(10) Patent No.: US 8,890,555 B2
(45) Date of Patent: Nov. 18, 2014

(54) METHOD FOR MEASURING TRANSISTOR

(75) Inventor: Takahiro Tsuji, Okayama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 839 days.

(21) Appl. No.: 13/093,172

(22) Filed: Apr. 25, 2011

(65) Prior Publication Data

US 2011/0267083 A1 Nov. 3, 2011

(30) Foreign Application Priority Data

Apr. 28, 2010 (JP) ................................. 2010-103909

(51) Int. Cl.
G01R 31/00 (2006.01)
G01R 31/26 (2014.01)
G01R 31/28 (2006.01)

(52) U.S. Cl.
CPC ........ G01R 31/2642 (2013.01); *G01R 31/2874* (2013.01); *G01R 31/2891* (2013.01); *G01R 31/2886* (2013.01)
USPC ............ 324/750.03; 324/760.01; 324/760.02; 324/762.08

(58) Field of Classification Search
CPC ............. G01R 31/2884; G01R 31/129; G01R 31/2621; Y02B 60/1285; H01L 29/786; H01L 29/7869; H01L 29/41733; H01L 29/42384; H01L 29/4908; H01L 29/78633; H01L 21/02554; H01L 22/00
USPC .............. 324/750.03, 760.01, 760.02, 762.08
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Arleen M Vazquez
*Assistant Examiner* — Sean Curtis
(74) *Attorney, Agent, or Firm* — Eric J. Robinson; Robinson Intellectual Property Law Office, P.C.

(57) ABSTRACT

An object is to provide a measuring method with high reproducibility in a bias-temperature stress test of a transistor in which an oxide semiconductor is used for a semiconductor layer. Provided is a measuring method of a transistor, which includes the steps of disposing a transistor in which an oxide semiconductor is used for a semiconductor layer in a measurement room having a light-blocking property, introducing dry air, nitrogen, or argon into the measurement room, and applying a predetermined voltage to a gate electrode of the transistor in the measurement room kept under an atmosphere where the dew point is greater than or equal to −110° C. and less than or equal to −60° C., whereby the amount of change in threshold voltage over time is measured.

13 Claims, 4 Drawing Sheets

(56) References Cited

U.S. PATENT DOCUMENTS

| | | | |
|---|---|---|---|
| 5,960,319 A * | 9/1999 | Iwata et al. | 438/664 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,295,030 B2 * | 11/2007 | Imura et al. | 324/762.09 |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0011520 A1 * | 1/2007 | Ikeda et al. | 714/724 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0149498 A1 * | 6/2008 | Yoo et al. | 205/777.5 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0139637 A1 * | 6/2011 | Ah et al. | 205/792 |
| 2011/0175081 A1 * | 7/2011 | Goyal et al. | 257/43 |
| 2012/0061663 A1 * | 3/2012 | Yamazaki et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-274210 | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 | 6/2006 |
| JP | 2006-165528 | 6/2006 |
| JP | 2006-165529 | 6/2006 |
| JP | 2009206508 A * | 9/2009 |
| JP | 2012084867 A * | 4/2012 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generational Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Transactions,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B; Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Revivew Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl Phys. Lett. (Applied Physics Letters), Sep. 1, 2003, vol. 83, No. 9, pp. 1755-1757.

Lee et al., "The effect of moisture on the photon-enhanced negative bias thermal instability in Ga—In—Zn—O thin film transistors," Applied Physics Letters, Issued Dec. 7, 2009, vol. 95, No. 23, pp. 232106-1-232106-3.

\* cited by examiner

METHOD FOR MEASURING TRANSISTOR

BACKGROUND OF THE INVENTION

1. Field of the Invention

The present invention relates to a method for measuring a transistor in which an oxide semiconductor is used for a semiconductor layer.

2. Description of the Related Art

In recent years, metal oxides having semiconductor characteristics (hereinafter, referred to as oxide semiconductors) have attracted attention. The metal oxides having semiconductor characteristics can be used for transistors. For example, in Patent Documents 1 to 3, thin film transistors in which an amorphous oxide (an oxide semiconductor) with an electron carrier concentration of lower than $10^{18}/cm^3$ is used for a semiconductor layer is disclosed.

A transistor when used in many types of products preferably has high reliability. Therefore, it is necessary to know characteristics of a transistor in an environment of practical usage.

As a method for examining the characteristics of a transistor, a bias-temperature stress test (hereinafter, also referred to as a BT test) is known. As the condition for the BT test, a temperature, a bias condition, and the like are considered (Patent Document 4).

REFERENCE

[Patent Document 1] Japanese Published Patent Application No. 2006-165527
[Patent Document 2] Japanese Published Patent Application No. 2006-165528
[Patent Document 3] Japanese Published Patent Application No. 2006-165529
[Patent Document 4] Japanese Published Patent Application No. 2001-274210

However, in the case of a transistor in which an oxide semiconductor is used for a semiconductor layer, there is a problem in that a reproducible result can not be obtained from the measurement result by the influence of variations in measurement conditions on the original characteristics of the transistor which is manufactured when the BT test is performed using a conventional measuring method.

Therefore, an object of one embodiment of the present invention is to provide a measuring method having high reproducibility in the bias-temperature stress test of a transistor in which an oxide semiconductor is used for a semiconductor layer, specifically, a measuring method having high reproducibility in the bias-temperature stress test in which negative potential is applied to a gate electrode of the transistor.

SUMMARY OF THE INVENTION

The bias-temperature stress test is performed in the air or in a measurement container which is electromagnetically shielded. It has turned out that influence of a measurement environment on the measurement result is considerable. There are various parameters as elements to be considered in the measurement environment, such as gas species surrounding samples, humidity, and atmospheric pressure. It has turned out that the influence of humidity (that is, water vapor included in a gas) on the measurement result is particularly remarkable.

More specifically, it has turned out that residual moisture (water vapor) in the measurement container for the BT test should be reduced as much as possible to an extent that the moisture does not adversely affect the BT test. In that case, the measurement environment is set in an atmosphere where the dew point is less than or equal to $-5°C.$, (preferably, less than or equal to $-30°C.$, more preferably, less than or equal to $-60°C.$), whereby variations in measurement results can be suppressed, and a transistor can be measured with high reproducibility.

One embodiment of the present invention is a measuring method of a transistor which includes the steps of disposing a transistor in which an oxide semiconductor is used for a semiconductor layer in a measurement room having a light-blocking property, introducing dry air, nitrogen, or argon into the measurement room, and applying a predetermined voltage to a gate electrode of the transistor in the measurement room kept under an atmosphere where the dew point is greater than or equal to $-110°C.$ and less than or equal to $-30°C.$, whereby the amount of change in threshold voltage over time is measured.

One embodiment of the present invention is a measuring method of a transistor which includes the steps of disposing a transistor in which an oxide semiconductor is used for a semiconductor layer in a measurement room having a light-blocking property, introducing dry air, nitrogen, or argon into the measurement room, and applying a predetermined voltage to a gate electrode of the transistor in the measurement room kept under an atmosphere where the dew point is greater than or equal to $-110°C.$ and less than or equal to $-60°C.$, whereby the amount of change in threshold voltage over time is measured.

Specifically, the dew point in the measurement room is set to greater than or equal to $-110°C.$ and less than or equal to $-60°C.$, whereby characteristics of a transistor can be stably measured.

In the above measuring method, the measurement room blocks light having a wavelength of 400 nm or less so as to prevent excitation in the oxide semiconductor, and the measurement room is filled with a dry inert gas so as to prevent influence of moisture on the oxide semiconductor.

In the above measuring method, it is preferable that the inside of the measurement room be evacuated before introducing dry air, nitrogen, or argon because the time required for making the measurement room having a desired atmosphere (e.g., an atmosphere in which the dew point is greater than or equal to $-110°C.$ and less than or equal to $-60°C.$) can be shortened.

According to one embodiment of the present invention, a measuring method having high reproducibility can be provided in the bias-temperature stress test of a transistor in which an oxide semiconductor is used for a semiconductor layer. Specifically, a measuring method having high reproducibility can be provided in the bias-temperature stress test in which negative potential is applied to a gate electrode of the transistor.

DETAILED DESCRIPTION OF THE INVENTION

Figure 1:
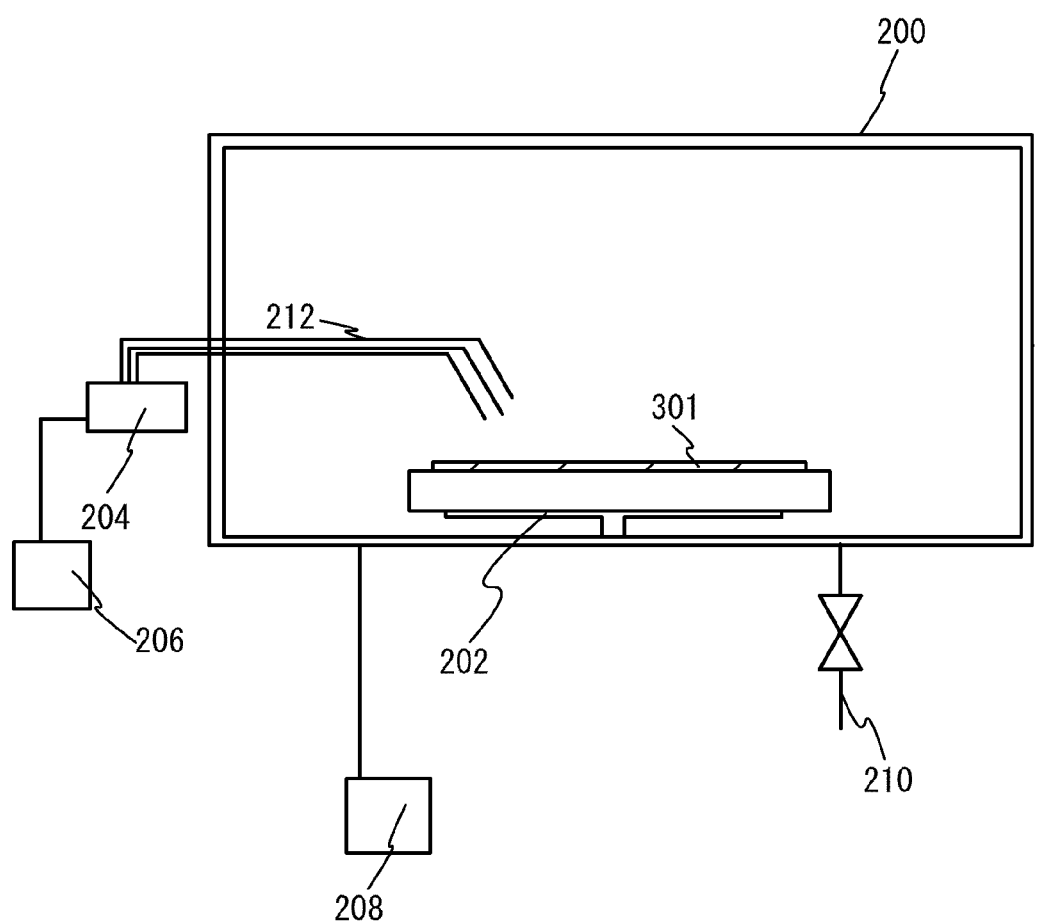
FIG. 1 illustrates an example of a measuring device in which a measuring method according to one embodiment of the present invention is performed.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a measuring method of a transistor in which an oxide semiconductor according to one embodiment of the present invention is used for a semiconductor layer is described with reference to FIG. 1.

In this embodiment, a bias-temperature stress test of a transistor is performed in a measurement room 200 shown in FIG. 1.

The measurement room 200 in FIG. 1 includes a stage 202 over which a sample 301 including a transistor in which an oxide semiconductor is used for a semiconductor layer is provided, a positioner 204, a semiconductor parameter analyzer 206, an evacuation unit 208, a gas introduction unit 210, and a probe 212.

In this embodiment, the stage 202 and the probe 212 are included in the measurement room 200; however, the structure of the measurement room 200 is not limited thereto and the positioner 204, the semiconductor parameter analyzer 206, and the like may be included in the measurement room 200. Further, a substrate heating unit, a unit for eliminating static charge, a pressure unit, and the like may be included. By performing acceleration measurement while a substrate is heated, measurement time for the bias-temperature stress test can be shortened. With the unit for eliminating static charge, static electricity of the inside of the measurement room or the sample can be eliminated.

In the measurement room 200, it is preferable that light having energy which is larger than energy gap of an oxide semiconductor be specifically blocked. By blocking such light, generation of free electrons in the oxide semiconductor can be prevented and change in characteristics of a transistor can be prevented. For example, when light having a wavelength of 400 nm or less is blocked, an effect of suppressing the change in characteristics of a transistor using an oxide semiconductor whose energy gap is greater than or equal to 3.1 eV can be obtained.

A load lock chamber connected to the measurement room 200 may be provided. It is preferable that the sample be taken in and out through the load lock chamber because entry of the outside air can be prevented when the sample is changed.

The stage 202 can move up and down, back and forth, or from side to side. The probe 212 can move up and down, back and forth, or from side to side when the positioner 204 is operated. The probe 212 is connected to the semiconductor parameter analyzer 206. The number of the probes is not specifically limited and may be determined as appropriate depending on the kinds and conditions of the measurement performed in the measurement room, for example, for a source electrode, a drain electrode, a gate electrode, a back gate electrode, and the like.

There is not a particular limitation on the evacuation unit 208 as long as it is a unit for evacuating air in the measurement room 200. When the evacuation unit 208 includes a cryopump, a turbo molecular pump, a dry pump, or the like, gas can be introduced after evacuating the measurement room. Thus, it is preferable that the evacuation unit 208 include a cryopump, a turbo molecular pump, a dry pump, or the like because the measurement room 200 can have a desired atmosphere in a short time.

As the gas to be introduced into the measurement room 200 from the gas introduction unit 210, an inert gas can be used, for example, a rare gas such as helium, argon or xenon, dry air, nitrogen, or the like can be used. In particular, dry air, nitrogen and argon, which are available at low cost, are preferably used.

The measurement room 200 can have an atmosphere in which humidity is sufficiently low by using the evacuation unit 208 and the gas introduction unit 210. In particular, the measurement room 200 can have an atmosphere in which the dew point is less than or equal to −5° C. (preferably, less than or equal to −30° C., more preferably, less than or equal to −60° C.) and greater than or equal to −110° C.

By making an atmosphere in the measurement room sufficiently low humidity, moisture in the measurement room, which has influence on characteristics of a transistor in which an oxide semiconductor is used for a semiconductor layer, can be extremely reduced compared to that in the air. Accordingly, measurement results with high reproducibility can be obtained by measuring the transistor in an atmosphere where humidity is sufficiently low.

When the transistor is measured in an atmosphere where the dew point is higher than −5° C., the characteristics of the transistor is changed by the influence of moisture in the atmosphere. While, when the measurement is performed in an atmosphere where the dew point is −110° C. or less, a high-performance dew-point meter is required compared to the conventional measuring method. Thus, the atmosphere in which the dew point is −110° C. or less is unfavorable for a configuration condition of the transistor. Accordingly, it is preferable that the transistor be measured in an atmosphere where humidity is sufficiently low, specifically, the dew point is greater than or equal to −110° C. and less than or equal to −5° C.

Although this embodiment describes a case of introducing a gas so that the measurement room 200 has an atmosphere in which humidity is sufficiently low as a whole, the measuring method according to one embodiment of the present invention is not limited to this. In other words, in the measuring method according to one embodiment of the present invention, it is only necessary that a measurement range including a region overlapping with a channel formation region of a transistor to be measured is kept under an atmosphere where humidity is sufficiently low. Therefore, for example, the region overlapping with the channel formation region of the transistor to be measured may be kept under an atmosphere where humidity is sufficiently low by blowing an inert gas over the region.

Next, a bias-temperature stress test of a transistor performed in the measurement room 200 shown in FIG. 1 is specifically described.

The bias-temperature stress test (BT test), which is one of methods for examining reliability of a transistor is performed using a measuring method according to one embodiment of the present invention. The BT test is one kind of accelerated test, and can evaluate a change in characteristics, caused by long-term usage, of a transistor in a short time. In this embodiment, a predetermined voltage is applied to a gate electrode of the transistor for a predetermined time period and the amount of change in threshold voltage over time is measured. The amount of change in threshold voltage before and after the BT test is an important factor for examining reliability. As a difference in the threshold voltage between before and after the BT test is small, the transistor has higher reliability.

In particular, the temperature of a substrate over which a transistor is formed is fixed. A source and a drain of the transistor are at the same potential, and potential different from the potential of the source and the drain is applied to a gate for a predetermined time period. The temperature of the substrate may be determined depending on the purpose of the test. The potential applied to the gate is higher than the potential of the source and the drain in a "+ gate BT test" while the potential applied to the gate is lower than the potential of the source and the drain in a "− gate BT test."

Strength of the BT test may be determined based on the temperature of a substrate and the electric field intensity and time period of application of the electric field to a gate insulating layer. The electric field intensity in a gate insulating layer is determined as the value of a potential difference between a gate, and a source and a drain divided by the value of the thickness of the gate insulating layer. For example, when an electric field intensity of the gate insulating layer having thickness of 100 nm is 2 MV/cm, the potential difference is 20 V.

This embodiment describes a case where −BT test is performed using a measuring method according to one embodiment of the present invention.

First, a sample 301 including a transistor in which an oxide semiconductor is used for a semiconductor layer is provided over the stage 202. Then, the stage 202 and the positioner 204 are operated and the sample 301 and the probe 212 are aligned so that a contact pad of the sample 301 is electrically connected to the probe 212.

Then, an inert gas is introduced into the measurement room 200 using the gas introduction unit 210. By introducing the inert gas, the inside of the measurement room 200 is to be an atmosphere in which humidity is sufficiently low. In particular, the inside of the measurement room 200 is to be an atmosphere in which the dew point is less than or equal to −5° C. (preferably, less than or equal to −30° C., more preferably, less than or equal to −60° C.). After that, the inside of the measurement room 200 is kept under the atmosphere until the measurement is completed.

In the case where evacuation can be performed using the evacuation unit 208, the evacuation may be performed before introducing a gas. It is preferable that the inside of the measurement room 200 be evacuated because the time required for making the measurement room 200 having a desired atmosphere (e.g., an atmosphere where the dew point is greater than or equal to −110° C. and less than or equal to −60° C.) can be shortened.

In the case where the stage 202 and the positioner 204 can be operated while the measurement room 200 is kept under an atmosphere where humidity is sufficiently low, the sample 301 and the probe 212 may be aligned after introducing the gas.

Then, initial characteristics of a transistor of the sample 301 are measured. In this embodiment, a change in characteristics of the drain current, i.e., $V_g$-$I_d$ characteristics, is measured under conditions that the substrate temperature is set to 25° C., the drain voltage is set to 10 V, and the gate voltage is varied from −10 V to +10 V. The initial characteristics are not limited to $V_g$-$I_d$ characteristics, and $V_d$-$I_d$ characteristics may be measured.

Next, the potential of the source and the drain of the transistor is set to 0 V while the substrate temperature is kept at 25° C. Then, negative voltage is kept being applied to the gate for 1 hour so that the intensity of an electric field applied to the gate insulating layer is 2 MV/cm. Electric field strength applied to the gate insulating layer and time period of application of voltage can be determined as appropriate based on desired purposes.

Lastly, $V_g$-$I_d$ characteristics of the transistor after the application of the voltage are measured under the same conditions as those of the measurement of the initial characteristics, and $V_g$-$I_d$ characteristics after the −BT test are obtained.

In the BT test, it is important to use a transistor which has been never subjected to a BT test. For example, if a −BT test is performed with use of a transistor which has been once subjected to a +BT test, the results of the −BT test cannot be evaluated correctly due to influence of the +BT test which has been performed previously. Further, the same applies to the case where a +BT test is again performed on a transistor which has been once subjected to a +BT test. Note that the same does not apply to the case where a BT test is intentionally repeated in consideration of these influences.

As described above, in the measuring method of a transistor according to one embodiment of the present invention, measurement is performed in an atmosphere where humidity is sufficiently low (specifically, an atmosphere where the dew point is greater than or equal to −110° C. and less than or equal to −5° C.). Thus, when a BT test of a transistor in which an oxide semiconductor is used for a semiconductor layer is performed using a measuring method according to one embodiment of the present invention, a change in characteristics of a transistor due to the influence of moisture in a measurement atmosphere can be prevented. Accordingly, measurement results with high reproducibility can be obtained.

This embodiment can be combined as appropriate with any of the other embodiments described in this specification.

Embodiment 2

In this embodiment, a structure of a transistor in which an oxide semiconductor is used for a semiconductor layer and which is measured according to one embodiment of the present invention and a manufacturing method of the transistor are described with reference to FIGS. 2A and 2B and FIGS. 3A to 3D.

There are many types of transistors. For example, transistors may be classified as a bottom gate-type structure and a top gate-type structure according to the positional relationship among a substrate, a gate, and a channel formation region. A transistor structure having a gate placed between a channel formation region and a substrate is called a bottom gate-type structure. A transistor structure having a channel formation region placed between a gate and a substrate is called a top gate-type structure.

In addition, transistors may be classified as a bottom contact type and a top contact type according to the connection position of a source and a drain with a semiconductor layer in which a channel is formed. A structure where the connection position of a source and a drain with a semiconductor layer in which a channel is formed is placed on a substrate side is called a bottom contact structure. A structure where the connection position of a source and a drain with a semiconductor layer in which a channel is formed is placed on a side opposite to a substrate is called a top contact structure.

In this embodiment, a bottom gate bottom contact transistor is described as an example of a transistor measured using a measuring method according to one embodiment of the present invention; however, the structure of the transistor in which an oxide semiconductor is used and which is measured using a measuring method according to one embodiment of the present invention is not particularly limited, and may be a bottom-gate type structure or a top-gate type structure. Further, the transistor may have a bottom contact structure or a top contact structure.

Figure 2A:
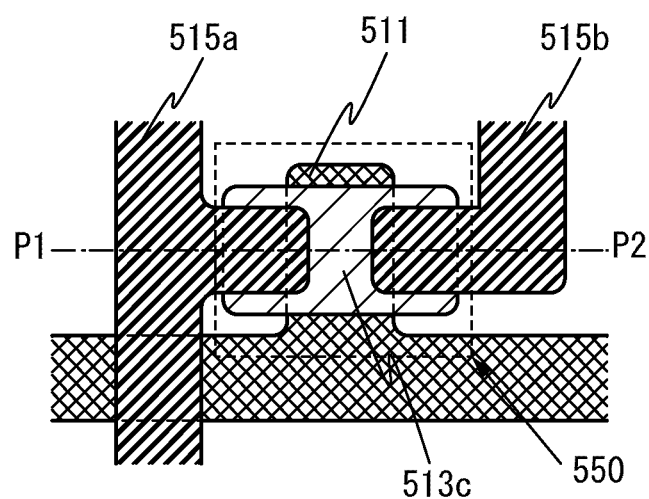
FIGS. 2A and 2B illustrate one example of a transistor measured using a measuring method according to one embodiment of the present invention.
Figure 2B:
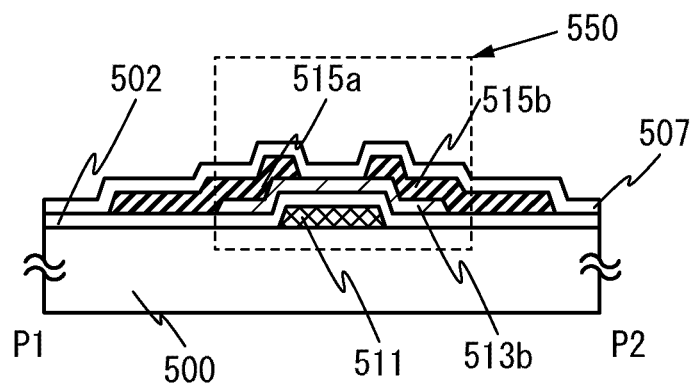

FIGS. 2A and 2B illustrate a structure of a transistor 550 that has a bottom-gate type structure manufactured in this embodiment. FIG. 2A is a top view of the transistor 550 and FIG. 2B is a cross-sectional view of the transistor 550. FIG. 2B illustrates a cross section along cutting line P1-P2 in FIG. 2A.

In the transistor 550, a gate electrode 511 and a gate insulating layer 502 which covers the gate electrode 511 are provided over a substrate 500 having an insulating surface. An oxide semiconductor layer 513b which overlaps with the gate electrode 511 is provided over the gate insulating layer 502. In addition, a first electrode 515a and a second electrode 515b, which are in contact with the oxide semiconductor layer 513b, each serve as a source electrode or drain electrode, and have end portions which overlaps with the gate electrode 511 are provided. Further, an insulating layer 507 which overlaps with the oxide semiconductor layer 513b and is in contact with part of the oxide semiconductor layer 513b is provided.

Next, a method for manufacturing the transistor 550 over the substrate 500 is described with reference to FIGS. 3A to 3D.

First, after a conductive film is formed over the substrate 500 having an insulating surface, a wiring layer including the gate electrode 511 is formed by a first photolithography step. Note that a resist mask may be formed by an inkjet method. Formation of the resist mask by an inkjet method needs no photomask; thus, manufacturing cost can be reduced.

In this embodiment, as the substrate 500 having an insulating surface, a glass substrate is used.

An insulating film serving as a base film may be provided between the substrate 500 and the gate electrode 511. The base film has a function of preventing diffusion of an impurity element from the substrate 500, and can be formed to have a single-layer structure or a stacked structure including one or more of a silicon nitride film, a silicon oxide film, a silicon nitride oxide film, and a silicon oxynitride film.

The gate electrode 511 can be formed to have a single-layer structure or a stacked structure including a metal material such as molybdenum, titanium, tantalum, tungsten, aluminum, copper, neodymium, or scandium, or an alloy material which contains any of these metal materials as its main component.

Next, the gate insulating layer 502 is formed over the gate electrode 511. The gate insulating layer 502 can be formed to have a single-layer structure or a stacked structure including a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by a plasma CVD method, a sputtering method, or the like.

As an oxide semiconductor in this embodiment, an oxide semiconductor which is made to be i-type (intrinsic) or substantially i-type by removing impurities (a highly purified oxide semiconductor) is used. Such a highly purified oxide semiconductor is highly sensitive to an interface state and interface charge; thus, an interface between the oxide semiconductor layer and the gate insulating layer is important. For that reason, the gate insulating layer that is to be in contact with a highly-purified oxide semiconductor needs to have high quality.

For example, a high-density plasma CVD method using microwaves (e.g., a frequency of 2.45 GHz) is preferably adopted because an insulating layer can be dense and can have high withstand voltage and high quality. The highly-purified oxide semiconductor and the high-quality gate insulating layer are in close contact with each other, whereby the interface state density can be reduced to obtain favorable interface characteristics.

Needless to say, another film formation method such as a sputtering method or a plasma CVD method can be employed as long as the method enables formation of a good-quality insulating layer as a gate insulating layer. Further, an insulating layer whose film quality and characteristic of the interface between the insulating layer and the oxide semiconductor are improved by heat treatment which is performed after the formation of the insulating layer may be formed as a gate insulating layer. In any case, any insulating layer can be used as long as it can reduce the interface state density between the gate insulating layer and the oxide semiconductor and form a favorable interface as well as having good film quality as the gate insulating layer.

In order that the gate insulating layer 502 and the oxide semiconductor film contain as little hydrogen, a hydroxyl group, and moisture as possible, it is preferable that as pretreatment of film formation of the oxide semiconductor film, the substrate 500 over which the gate electrode 511 is formed or the substrate 500 over which layers up to the gate insulating layer 502 are formed be preheated in a preheating chamber of a sputtering apparatus, so that impurities such as hydrogen or moisture adsorbed onto the substrate 500 are eliminated and exhausted. As an exhaustion unit provided in the preheating chamber, a cryopump is preferable. Note that this preheating treatment can be omitted. Further, the above preheating may be performed in a similar manner on the substrate 500 in a state where the first electrode 515a and the second electrode 515b have been formed thereover but the insulating layer 507 has not been formed yet.

Figure 3A:
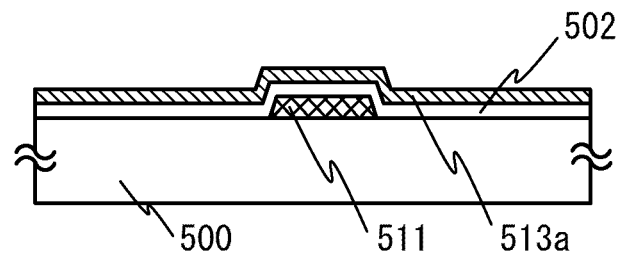
FIGS. 3A to 3D illustrate one example of a method for manufacturing a transistor measured using a measuring method according to one embodiment of the present invention.

Next, over the gate insulating layer 502, an oxide semiconductor film 513a having a thickness of greater than or equal to 2 nm and less than or equal to 200 nm, preferably greater than or equal to 5 nm and less than or equal to 30 nm is formed (FIG. 3A).

Note that before the oxide semiconductor film 513a is formed by a sputtering method, powdery substances (also referred to as particles or dust) which are attached on a surface of the gate insulating layer 502 are preferably removed by reverse sputtering in which an argon gas is introduced and plasma is generated. The reverse sputtering refers to a method in which an RF power supply is used for application of voltage to a substrate side in an argon atmosphere and plasma is generated near the substrate to modify a surface. Note that an atmosphere of nitrogen, helium, oxygen, or the like may be used instead of an argon atmosphere.

As an oxide semiconductor used for the oxide semiconductor film 513a, the following metal oxide can be used: a four-component metal oxide such as an In—Sn—Ga—Zn—O based oxide semiconductor; a three-component metal oxide such as an In—Ga—Zn—O based oxide semiconductor, an In—Sn—Zn—O based oxide semiconductor, an In—Al—Zn—O based oxide semiconductor, a Sn—Ga—Zn—O based oxide semiconductor, an Al—Ga—Zn—O based oxide semiconductor, or a Sn—Al—Zn—O based oxide semiconductor; a two-component metal oxide such as an In—Zn—O based oxide semiconductor, a Sn—Zn—O based oxide semiconductor, an Al—Zn—O based oxide semiconductor, a Zn—Mg—O based oxide semiconductor, a Sn—Mg—O based oxide semiconductor, an In—Ga—O based oxide semiconductor, or an In—Mg—O based oxide semiconductor; an one-component metal oxide such as an In—O based oxide semiconductor, a Sn—O based oxide semiconductor, or a Zn—O based oxide semiconductor; or the like. Further, $SiO_2$ may be contained in the above oxide semiconductor. In this specification, for example, an In—Ga—Zn—O-based oxide semiconductor means an oxide film containing indium (In), gallium (Ga), and zinc (Zn), and there is no particular limitation on the composition ratio. Further, the In—Ga—Zn—O-based oxide semiconductor may contain an element other than In, Ga, and Zn. In this embodiment, the oxide semiconductor film is formed using an In—Ga—Zn—O-based oxide target by a sputtering method.

In the case where an In—Zn—O-based material is used as the oxidesemiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, when a target used for forming the In—Zn—O-based oxide semiconductor has a composition ratio of In:Zn:O=x:y:z in an atomic ratio, Z>(1.5x+y).

The target used for formation of the oxide semiconductor film 513a by a sputtering method is, for example, an oxide target containing $In_2O_3$, $Ga_2O_3$, and ZnO at a composition ratio of 1:1:1 [molar ratio], so that an In—Ga—Zn—O film is formed. Without limitation to the material and the composition of the above target, for example, an oxide target containing $In_2O_3$, $Ga_2O_3$, and ZnO at a composition ratio of 1:1:2 [molar ratio] may be used.

The filling rate of the oxide target is higher than or equal to 90% and lower than or equal to 100%, preferably higher than or equal to 95% and lower than or equal to 99.9%. With use of the metal oxide target with high filling rate, a dense oxide semiconductor film can be formed.

It is preferable that a high-purity gas from which impurities such as hydrogen, water, hydroxyl, or hydride are removed be used as the sputtering gas for the formation of the oxide semiconductor film 513a.

The substrate is held in a film-formation chamber kept under reduced pressure, and the substrate temperature is set to temperatures higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. Then, a sputtering gas from which hydrogen and moisture are removed is introduced while residual moisture in the film-formation chamber is removed, and the oxide semiconductor film is formed over the substrate 500 using the above target. In order to remove moisture remaining in the film-formation chamber, an entrapment vacuum pump such as a cryopump, an ion pump, or a titanium sublimation pump is preferably used. The evacuation unit may be a turbo pump provided with a cold trap. In the film-formation chamber which is evacuated with the cryopump, for example, hydrogen, a compound containing hydrogen such as water (further preferably, also a compound containing carbon), and the like are removed, so that the concentration of impurities contained in the oxide semiconductor film formed in the film-formation chamber can be reduced.

The atmosphere for a sputtering method may be a rare gas (typically argon) atmosphere, an oxygen atmosphere, or a mixed atmosphere containing a rare gas and oxygen.

As one example of the film-formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power source is preferably used, in which case powder substances (also referred to as particles or dust) that are generated in the film formation can be reduced and the film thickness can be uniform.

Figure 3B:
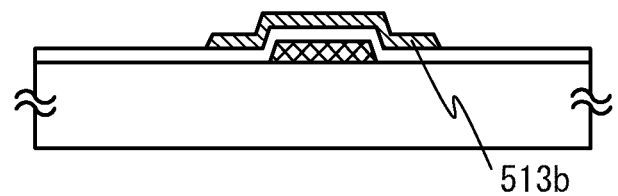

Next, the oxide semiconductor film 513a is processed into an island-shaped oxide semiconductor layer 513b by a second photolithography step (FIG. 3B). A resist mask for forming the island-shaped semiconductor layer may be formed by an inkjet method. Formation of the resist mask by an inkjet method needs no photomask; thus, manufacturing cost can be reduced.

In addition, in the case where a contact hole is formed in the gate insulating layer 502, a step of forming the contact hole can be performed at the same time as processing of the oxide semiconductor film.

Note that the etching of the oxide semiconductor film 513a may be dry etching, wet etching, or both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used.

Next, first heat treatment is performed on the oxide semiconductor layer 513b. The oxide semiconductor layer can be dehydrated or dehydrogenated by this first heat treatment. The temperature of the first heat treatment is higher than or equal to 400° C. and lower than or equal to 750° C., or higher than or equal to 400° C. and lower than the strain point of the substrate. In this embodiment, heat treatment is performed on the oxide semiconductor layer 513b at 450° C. for 1 hour under a nitrogen atmosphere. Note that there is no particular limitation on timing of the first heat treatment as long as it is after formation of the oxide semiconductor film 513a and may be before or after the formation of the oxide semiconductor layer 513b. Further, the atmosphere for performing the first heating treatment may be not only a nitrogen atmosphere, but also an atmosphere including oxygen and nitrogen, an oxygen atmosphere, and an atmosphere from which moisture is sufficiently removed (dry air). After the first heat treatment, the oxide layer is preferably formed without exposing the oxide semiconductor layer 513b to the air so that water or hydrogen can be prevented from reentering the oxide semiconductor layer.

Note that the heat treatment apparatus is not limited to the electric furnace, and an apparatus for heating an object by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which be introduced into a heat treatment apparatus be set to 6N (99.9999%) or higher, preferably 7N (99.99999%) or higher (that is, the concentration of an impurity is 1 ppm or lower, preferably 0.1 ppm or lower).

After the oxide semiconductor layer is heated in the first heat treatment, a high-purity oxygen gas, a high-purity $N_2O$ gas, or ultra-dry air (having the dew point lower than or equal to $-40°$ C., preferably lower than or equal to $-60°$ C.) may be introduced into the furnace. It is preferable that the oxygen gas and the $N_2O$ gas do not include water, hydrogen, and the like. The purity of the oxygen gas or the $N_2O$ gas which is introduced into the heat treatment apparatus is preferably 6N or higher, preferably 7N or higher (i.e., the concentration of an impurity in the oxygen gas or the $N_2O$ gas is preferably 1 ppm or lower, more preferably 0.1 ppm or lower). By the action of the oxygen gas or the $N_2O$ gas, oxygen which is a main component of the oxide semiconductor can be supplied.

In the case where the contact hole is formed in the gate insulating layer 502, a step of forming the contact hole may be performed either before or after the first heat treatment is performed on the oxide semiconductor film.

In addition, an oxide semiconductor film having crystal regions with a large thickness, that is, crystal regions that are c-axis aligned perpendicularly to the surface of the film may be formed by forming the oxide semiconductor film in twice and performing heat treatment in twice, which can be formed regardless of a material of a base component with which the oxide semiconductor film formed first is in contact, such as an oxide, a nitride, a metal, or the like. For example, a first oxide semiconductor film with a thickness of greater than or equal to 3 nm and less than or equal to 15 nm is formed and first heat treatment is performed in a nitrogen, oxygen, a rare gas, or dry air atmosphere at a temperature of higher than or equal to 450° C. and lower than or equal to 850° C., whereby a first oxide semiconductor film having a crystal region (including a plate-shaped crystal) in a region including a surface is formed. Then, a second oxide semiconductor film which has a larger thickness than the first oxide semiconductor film is formed, and second heat treatment is performed at a temperature of higher than or equal to 450° C. and lower than or equal to 850° C., whereby crystal growth proceeds upward with the use of the first oxide semiconductor film as a seed of the crystal growth and the entire second oxide semiconductor film is crystallized. In such a manner, the oxide semiconductor film having a crystal region with a large thickness may be formed.

Next, a conductive film serving as a source electrode or drain electrode (including a wiring formed in the same layer as the source electrode and the drain electrode) is formed over the gate insulating layer 502 and the oxide semiconductor layer 513b. As the conductive film used for the source electrode and the drain electrode, for example, a metal film containing an element selected from Al, Cr, Cu, Ta, Ti, Mo, and W, a metal nitride film containing any of the above elements as its main component (a titanium nitride film, a molybdenum nitride film, or a tungsten nitride film), or the like can be used. Alternatively, a film of a high-melting-point metal such as Ti, Mo, or W or a metal nitride film (e.g., a titanium nitride film, a molybdenum nitride film, or a tungsten nitride film) may be formed over or/and below the metal film such as an Al film or a Cu film. In particular, it is preferable to provide a conductive film containing titanium on the side in contact with the oxide semiconductor layer.

Figure 3C:
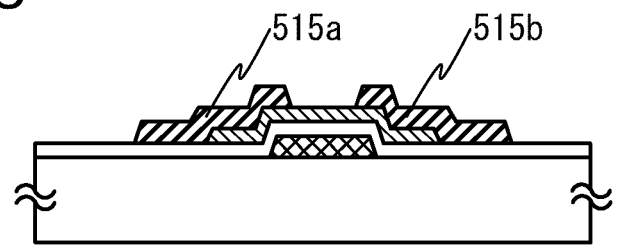

Next, a resist mask is formed over the conductive film by a third photolithography step; the first electrode 515a and the second electrode 515b each serving as a source electrode or drain electrode are formed by selective etching, and then the resist mask is removed (see FIG. 3C).

Light exposure at the time of forming the resist mask in the third photolithography step may be performed using ultraviolet light, KrF laser light, or ArF laser light. A channel length (L) of a transistor to be formed later is determined by a distance between bottom end portions of the first electrode and the second electrode, which are adjacent to each other over the oxide semiconductor layer 513b. In the case where light exposure is performed for a channel length L of less than 25 nm, the light exposure at the time of forming the resist mask in the third photolithography step may be performed using extreme ultraviolet light having an extremely short wavelength of several nanometers to several tens of nanometers. In the light exposure by extreme ultraviolet light, the resolution is high and the focus depth is large. Thus, the channel length L of the transistor that is completed later can be greater than or equal to 10 nm and less than or equal to 1000 nm and the operation speed of a circuit can be increased.

In order to reduce the number of photomasks used in a photolithography step and reduce the number of photolithography steps, an etching step may be performed with the use of a resist mask formed using a multi-tone mask which is a light-exposure mask through which light is transmitted to have various intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Note that it is preferable that etching conditions be optimized so as not to etch and divide the oxide semiconductor layer 513b when the conductive film is etched. However, it is difficult to obtain etching conditions in which only the conductive film is etched and the oxide semiconductor layer 513b is not etched at all. In some cases, when the conductive film is etched, only part of the oxide semiconductor layer 513b is etched to be an oxide semiconductor layer 513b having a groove portion (a recessed portion).

In this embodiment, a Ti film is used as the conductive film and an In—Ga—Zn—O-based oxide semiconductor is used as the oxide semiconductor layer 513b. In such a combination, ammonia hydrogen peroxide (a mixed solution of ammonia, water, and hydrogen peroxide) is preferably used as an etchant.

Figure 3D:
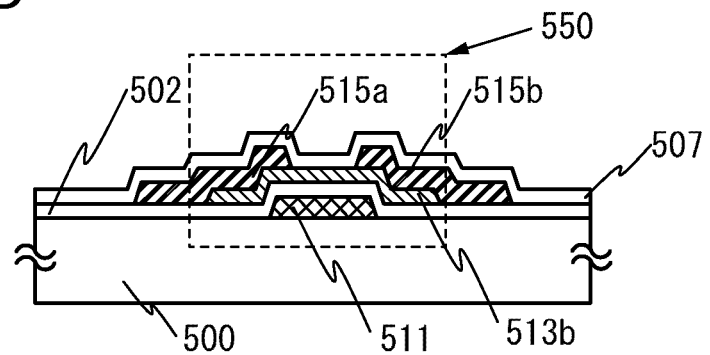

Next, water or the like adsorbed to a surface of an exposed portion of the oxide semiconductor layer may be removed by plasma treatment using a gas such as $N_2O$, $N_2$, or Ar. In the case where the plasma treatment is performed, the insulating layer 507 serving as a protective insulating film in contact with part of the oxide semiconductor layer is formed without being exposed to the air after the plasma treatment (FIG. 3D).

The insulating layer 507 can be formed to a thickness of at least 1 nm by a method by which impurities such as water and hydrogen do not enter the insulating layer 507, such as a sputtering method, as appropriate. When hydrogen is contained in the insulating layer 507, entry of the hydrogen into the oxide semiconductor layer or extraction of oxygen from the oxide semiconductor layer by the hydrogen is caused, thereby causing the backchannel of the oxide semiconductor layer to have lower resistance (to have n-type conductivity), so that a parasitic channel might be formed. Therefore, it is important that a film formation method in which hydrogen is not used be employed so that the insulating layer 507 containing as little hydrogen as possible is formed.

In this embodiment, a silicon oxide film is formed to a thickness of 200 nm as the insulating layer 507 by a sputtering method. The substrate temperature in film formation may be higher than or equal to room temperature and lower than or equal to 300° C. and in this embodiment, is 100° C. The silicon oxide film can be formed by a sputtering method in a rare gas (typically, argon) atmosphere, an oxygen atmosphere, or a mixed atmosphere of a rare gas and oxygen. As a target, a silicon oxide target or a silicon target may be used. For example, the silicon oxide film can be formed with the use of a silicon target by a sputtering method in an atmosphere containing oxygen. As the insulating layer 507 which is formed in contact with the oxide semiconductor layer, an inorganic insulating film which does not contain impurities such as water, or hydrogen and blocks entry of these from the outside is used. Typically, a silicon oxide film, a silicon oxynitride film, an aluminum oxide film, an aluminum oxynitride film, or the like is used.

In order to remove residual moisture from the film-formation chamber of the insulating layer 507 in a manner similar to the film formation of the oxide semiconductor film, an entrapment vacuum pump (such as a cryopump) is preferably used. When the insulating layer 507 is formed in the film-formation chamber evacuated using a cryopump, the impurity concentration in the insulating layer 507 can be reduced. In addition, as an evacuation unit for removing the residual moisture in the film-formation chamber of the insulating layer 507, a turbo pump provided with a cold trap may be used.

Further, a high-purity gas from which impurities such as hydrogen, water, hydroxyl group, or hydride are removed is preferably used as a sputtering gas used in formation of the insulating layer 507.

Next, second heat treatment (third heat treatment in the case where film formation and heat treatment of the oxide semiconductor layer are each performed twice) may be performed in an inert gas atmosphere or an oxygen gas atmosphere. The heat treatment is preferably performed at a temperature of higher than or equal to 200° C. and lower than or equal to 400° C., for example preferably at a temperature of higher than or equal to 250° C. and lower than or equal to 350° C. For example, the second heat treatment is performed in a nitrogen atmosphere at 250° C. for one hour. When the second heat treatment is performed, part of the oxide semiconductor layer is heated in the state of being in contact with the insulating layer 507.

When a silicon oxide layer having a lot of defects is used as the insulating layer 507, the second heat treatment after formation of the silicon oxide layer has an effect of diffusing an impurity such as hydrogen or water contained in the oxide semiconductor layer to the silicon oxide layer so that the impurity contained in the oxide semiconductor layer can be further reduced.

A protective insulating layer may be additionally formed over the insulating layer 507. The protective insulating layer is formed by, for example, an RF sputtering method. The RF sputtering method is preferable as a film formation method of the protective insulating layer because it achieves high mass productivity. As the protective insulating layer, an inorganic insulating film which does not contain impurities such as moisture and blocks the entry of the impurities from the outside is used; for example, a silicon nitride film, an aluminum nitride film, or the like is used.

After the formation of the protective insulating layer, heat treatment may be further performed at a temperature of higher than or equal to 100° C. and lower than or equal to 200° C. in the air for 1 hour to 30 hours inclusive. This heat treatment may be performed at a fixed heating temperature. Alternatively, the following change in the heating temperature may be conducted plural times repeatedly: the heating temperature is increased from room temperature to a temperature of higher than or equal to 100° C. and lower than or equal to 200° C. and then decreased to room temperature.

As described above, a transistor in which an oxide semiconductor is used for a semiconductor layer can be manufactured. When the transistor thus manufactured is measured according to one embodiment of the present invention illustrated in Embodiment 1, measurement results with high reproducibility can be obtained.

Note that as an oxide semiconductor in this embodiment, an oxide semiconductor which is made to be i-type or substantially i-type by removing impurities is used; however, there is not a particular limitation on the oxide semiconductor which is used as the semiconductor layer included in the transistor measured by a measuring method according to one embodiment of the present invention.

This embodiment can be freely combined with any of the other embodiments in this specification.

Example 1

This embodiment describes −BT test performed on the transistor in which an oxide semiconductor was used for a semiconductor layer, which was performed using a measuring method according to one embodiment of the present invention.

First, a manufacturing method of a transistor used in this example is described with reference to FIGS. 2A and 2B. There were six kinds of samples and two for each sample were manufactured. Hereinafter, the samples including the transistors are referred to as sample 1 to sample 12. Each of the sample 1 to sample 12 has a different channel length and channel width, and the details are as illustrated in table 1.

TABLE 1

|  | channel length L (μm) | channel width W (μm) |
| --- | --- | --- |
| sample 1, sample 7 | 3 | 20 |
| sample 2, sample 8 | 6 | 20 |
| sample 3, sample 9 | 20 | 20 |
| sample 4, sample 10 | 3 | 50 |
| sample 5, sample 11 | 6 | 50 |
| sample 6, sample 12 | 20 | 50 |

First, a tungsten film was formed with a film thickness of 100 nm over a glass substrate, and a wiring layer including the gate electrode 511 was formed by the first photolithography step.

Next, over the gate electrode 511, a silicon oxynitride film was formed as the gate insulating layer 502, with a thickness of 100 nm by a high-density plasma CVD method.

Next, over the gate insulating layer 502, an oxide semiconductor film with a thickness of 25 nm was formed by a sputtering method. A target used for the formation of the oxide semiconductor film by a sputtering method was, for example, an oxide target containing $In_2O_3$, $Ga_2O_3$, and ZnO at a composition ratio of 1:1:1 [molar ratio], so that an In—Ga—Zn—O film was formed. The oxide semiconductor film was formed, while the substrate was heated at 200° C. during the film formation. An example of the other film-formation conditions was as follows: the pressure was 0.6 Pa, the direct current (DC) power was 5 kW, and the atmosphere was an atmosphere containing oxygen and argon (the flow ratio of oxygen to argon was 1:1).

Then, the oxide semiconductor film was processed into an island-shaped oxide semiconductor layer 513b in the second photolithography step.

Then, the island-shaped oxide semiconductor layer 513b was subjected to heat treatment using a rapid thermal anneal (RTA) apparatus at 650° C. in a nitrogen atmosphere for 6 minutes and again subjected to heat treatment with use of a clean oven at 450° C. in an atmosphere containing nitrogen and oxygen (the flow ratio of nitrogen to oxygen was 4:1) for 1 hour.

Next, a conductive film serving as a source electrode and a drain electrode (including a wiring formed in the same layer as the source electrode and the drain electrode) was formed over the gate insulating layer 502 and the oxide semiconductor layer 513b. In this example, the conductive film was formed to have a three-layer structure in which a 100-nm-thick aluminum film, a 200-nm-thick aluminum film, and 100-nm-thick titanium film were formed in this order. Then, the first electrode 515a and the second electrode 515b which each function as a source or drain electrode are formed by the third photolithography step.

Next, the insulating layer 507 which is in contact with part of the oxide semiconductor layer 513b was formed. In this example, a silicon oxide film with a film thickness of 300 nm was formed by a sputtering method. Before the oxide silicon film was formed, preheating was performed at 200° C. for 5 minutes in an oxygen atmosphere. As the target used for the formation of the oxide silicon film by a sputtering method, a silicon target was used in an oxygen atmosphere, and direct current (DC) power was set to 5 kW.

Next, heat treatment was performed with use of a clean oven at 250° C. for 1 hour.

−BT test was performed on the transistors (the transistor 550 in FIGS. 2A and 2B) of the sample 1 to sample 12. Specifically, −BT test was performed on the transistors of the sample 1 to sample 6 in an atmosphere where the dew point is −45° C. using a measuring method of a transistor according to one embodiment of the present invention. −BT test was performed on the transistors of the sample 7 to sample 12 in the air (an atmosphere in which the dew point is approximately 1° C. to 10° C.). A procedure of the −BT test on the sample 1 and sample 7 is described below. The −BT test on the sample 2 to sample 6 is performed following a procedure similar to that of the sample 1, and the −BT test on the sample 8 to sample 12 is performed following a procedure similar to that of the sample 7; thus, detailed description is omitted.

<Sample 1>

First, the sample 1 (the sample 301 in FIG. 1) including a transistor manufactured according to the above manufacturing method was introduced into the measurement room 200, and disposed over the stage 202.

Next, the stage 202 and the positioner 204 were operated and the sample 1 and the probe 212 were aligned so that the contact pad of the sample 1 was in contact with the probe 212.

Then, dry air was introduced into the measurement room 200 using the gas introduction unit 210, so that the inside of the measurement room 200 was an atmosphere in which the dew point was −45° C., and after that, the atmosphere was kept until the measurement was completed.

Then, initial characteristics of the transistor were measured. As for the initial characteristics, a change in characteristics of a drain current under conditions that the substrate temperature was set to 25° C., the drain voltage was set to 10 V, and the gate voltage was varied from −10 V to +10 V, i.e., $V_g$-$I_d$ characteristics, was measured.

Next, the potential of the source and the drain of the transistor was set to 0 V while the substrate temperature was held at 25° C. Then, voltage of −20 V was applied to the gate so that the intensity of an electric field applied to the gate insulating layer was −2 MV/cm.

After the voltage was applied to the transistor and held for 100 seconds, $V_g$-$I_d$ characteristics of the transistor were measured under the same conditions as those of the measurement of the initial characteristics. Similarly, after the voltage was held for 300 seconds, 600 second, 1000 second, 1800 seconds, 3600 seconds, 7200 seconds, and 10000 seconds, $V_g$-$I_d$ characteristics of the transistor were measured under the same conditions as those of the measurement of the initial characteristics.

<Sample 7>

First, the sample 7 (the sample 301 in FIG. 1) including a transistor manufactured according to the above manufacturing method was introduced into the measurement room 200, and arranged over the stage 202.

Next, the stage 202 and the positioner 204 were operated and the sample 7 and the probe 212 were aligned so that the contact pad of the sample 7 was electrically connected to the probe 212.

Then, initial characteristics of the transistor were measured. As for the initial characteristics, a change in characteristics of a drain current under conditions that the substrate temperature was set to 25° C., the drain voltage was set to 10 V, and the gate voltage was varied from −10 V to +10 V, i.e., $V_g$-$I_d$ characteristics, was measured.

Next, the potential of the source and the drain of the transistor was set to 0 V while the substrate temperature was held at 25° C. Then, voltage of −20 V was applied to the gate so that the intensity of an electric field applied to the gate insulating layer was −2 MV/cm.

After the voltage was applied to the transistor and held for 100 seconds, $V_g$-$I_d$ characteristics of the transistor were measured under the same conditions as those of the measurement of the initial characteristics. Similarly, after the voltage was held for 300 seconds, 600 second, 1000 second, 1800 seconds, 3600 seconds, 7200 seconds, and 10000 seconds, $V_g$-$I_d$ characteristics of the transistor were measured under the same conditions as those of the measurement of the initial characteristics.

Figure 4A:
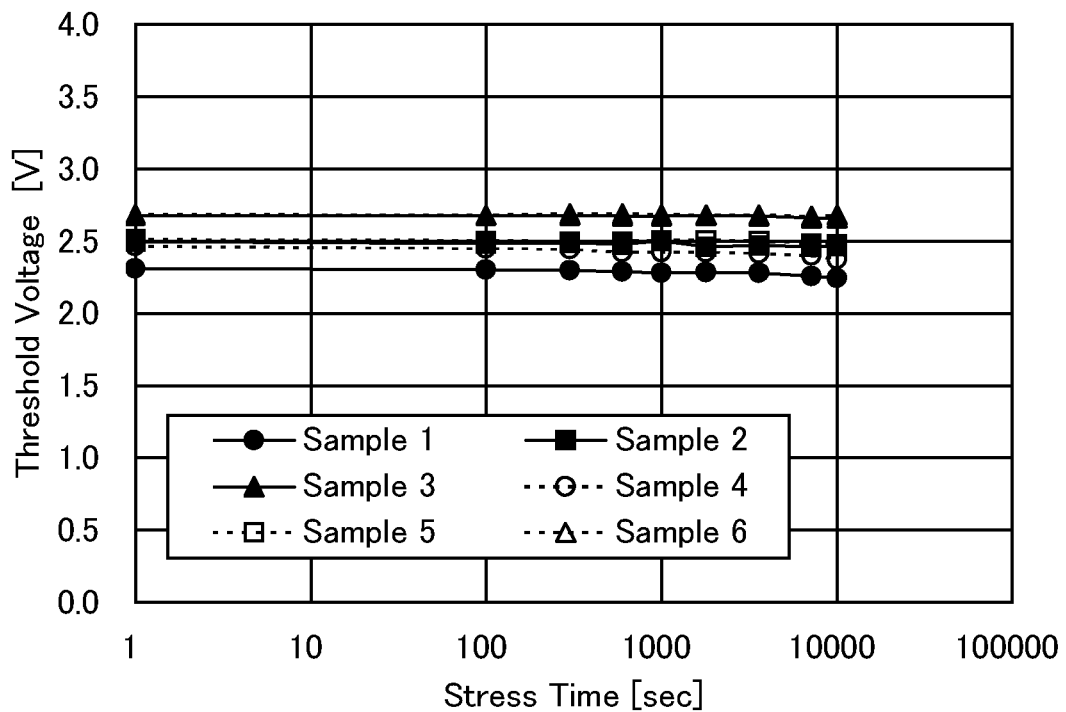
FIGS. 4A and 4B show results of a BT test according to Example.
Figure 4B:
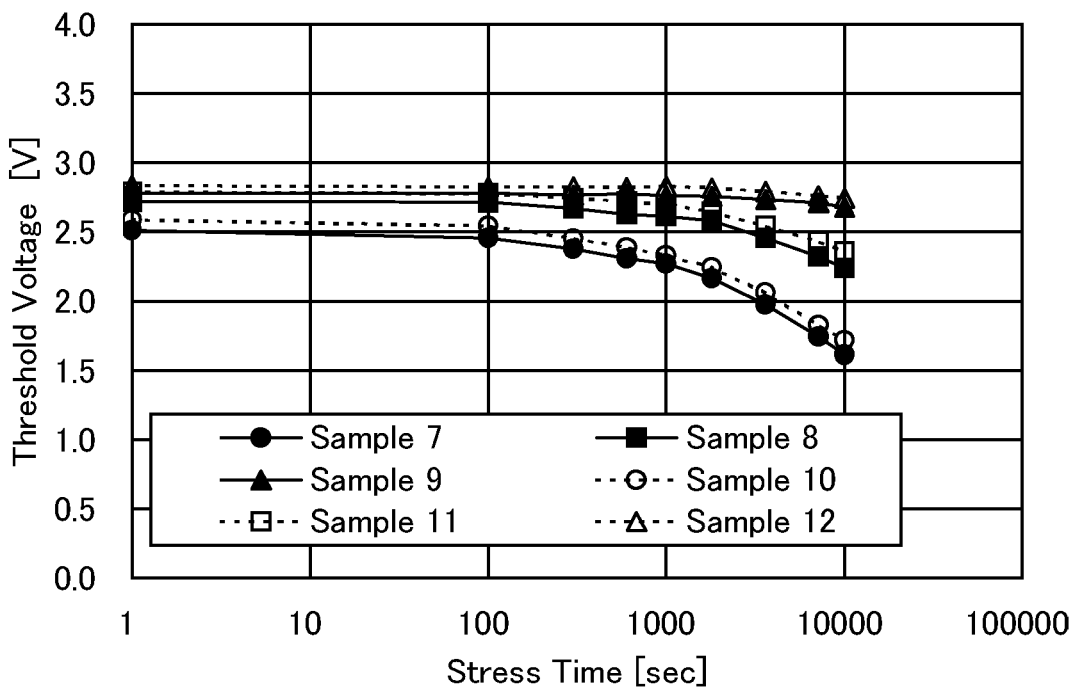

As described above, −BT test of the sample 1 to sample 7 was performed. FIGS. 4A and 4B show graphs illustrating a change in threshold voltage from the initial characteristics after the −BT test. FIG. 4A is the change in threshold voltage of the sample 1 to sample 6, and FIG. 4B is the change in threshold voltage of the sample 7 to sample 12. In FIGS. 4A and 4B, the horizontal axis represents time for which voltage is applied (hereinafter, stress time) and the vertical axis represents the threshold voltage (V).

As shown in FIG. 4A, in the sample 1 to sample 6 (specifically, the measurement was performed in an atmosphere where the dew point was −45° C.), there were almost no difference between the threshold voltage when the stress time was 10000 seconds and the threshold voltage in the initial characteristics (stress time was 1 second in FIG. 4A).

On the other hand, as shown in FIG. 4B, in the sample 7 to sample 12 which are measured in the air, the threshold voltage when the stress time was 10000 seconds is changed from the threshold voltage in the initial characteristics.

Consequently, it was found that there was a difference in results between the sample measured in the air and the sample measured in the atmosphere where the dew point was −45° C. This shows moisture in a measurement atmosphere has an influence on the characteristics of a transistor in which an oxide semiconductor is used for a semiconductor layer.

The humidity in the air varies depending on the weather and the like; thus, measurement results with high reproducibility can not be obtained when the measurement of a transistor is performed in the air. In the measurement method of a transistor according to one embodiment of the present invention, measurement is performed in an atmosphere where humidity is sufficiently low (specifically, an atmosphere in which the dew point is less than or equal to −5° C. and greater than or equal to −110° C.). Therefore, when measurement is performed by the measuring method according to one embodiment of the present invention, a change in characteristics of the transistor due to the influence of moisture in the measurement atmosphere can be prevented. Thus, measurement results with high reproducibility can be obtained.

This application is based on Japanese Patent Application serial no. 2010-103909 filed with Japan Patent Office on Apr. 28, 2010, the entire contents of which are hereby incorporated by reference.

What is claimed is:

1. A measuring method of a transistor comprising the steps of:
   disposing a transistor comprising a semiconductor layer in a measurement room, wherein the semiconductor layer comprises an oxide semiconductor;
   introducing one of dry air, nitrogen and argon into the measurement room to make the measurement room of an atmosphere having a dew point of greater than or equal to −110° C. and less than or equal to −30° C.;
   performing a first measurement of a threshold voltage of the transistor in the measurement room kept under the atmosphere;
   applying a predetermined voltage to a gate of the transistor in the measurement room kept under the atmosphere after performing the first measurement; and
   performing a second measurement of the threshold voltage of the transistor in the measurement room kept under the atmosphere after applying the predetermined voltage to the gate of the transistor.

2. The measuring method according to claim 1, wherein the measurement room has a light-blocking property.

3. The measuring method according to claim 1, wherein the measurement room has a light-blocking property to light having a wavelength of 400 nm or less.

4. The measuring method according to claim 1, wherein the oxide semiconductor is intrinsic or substantially intrinsic.

5. A measuring method of a transistor comprising the steps of:
   disposing a transistor comprising a semiconductor layer in a measurement room, wherein the semiconductor layer comprises an oxide semiconductor;
   introducing one of dry air, nitrogen and argon into the measurement room to make the measurement room of an atmosphere having a dew point of greater than or equal to −110° C. and less than or equal to −60° C.;
   performing a first measurement of a threshold voltage of the transistor in the measurement room kept under the atmosphere;
   applying a predetermined voltage to a gate of the transistor in the measurement room kept under the atmosphere after performing the first measurement; and
   performing a second measurement of the threshold voltage of the transistor in the measurement room kept under the atmosphere after applying the predetermined voltage to the gate of the transistor.

6. The measuring method according to claim 5, wherein before introducing the one of dry air, nitrogen and argon into the measurement room, an inside of the measurement room is evacuated.

7. The measuring method according to claim 5, wherein the measurement room has a light-blocking property.

8. The measuring method according to claim 5, wherein the measurement room has a light-blocking property to light having a wavelength of 400 nm or less.

9. The measuring method according to claim 5, wherein the oxide semiconductor is intrinsic or substantially intrinsic.

10. A measuring method of a transistor comprising the steps of:
    disposing a transistor comprising a semiconductor layer in a measurement room, wherein the semiconductor layer comprises an oxide semiconductor;
    evacuating an inside of the measurement room;
    introducing one of dry air, nitrogen and argon into the evacuated measurement room to make the measurement room of an atmosphere having a dew point of greater than or equal to −110° C. and less than or equal to −30° C.;
    performing a first measurement of a threshold voltage of the transistor in the measurement room kept under the atmosphere;
    applying a predetermined voltage to a gate of the transistor in the measurement room kept under the atmosphere after performing the first measurement; and
    performing a second measurement of the threshold voltage of the transistor in the measurement room kept under the atmosphere after applying the predetermined voltage to the gate of the transistor.

11. The measuring method according to claim 10, wherein the measurement room has a light-blocking property.

12. The measuring method according to claim 10, wherein the measurement room has a light-blocking property to light having a wavelength of 400 nm or less.

13. The measuring method according to claim 10, wherein the oxide semiconductor is intrinsic or substantially intrinsic.

* * * * *